United States Patent
Maldonado

(10) Patent No.: US 6,258,491 B1
(45) Date of Patent: Jul. 10, 2001

(54) MASK FOR HIGH RESOLUTION OPTICAL LITHOGRAPHY

(75) Inventor: Juan R. Maldonado, Menlo Park, CA (US)

(73) Assignee: Etec Systems, Inc., Hayward, CA (US)

(*) Notice: Subject to any disclaimer, the term of this patent is extended or adjusted under 35 U.S.C. 154(b) by 0 days.

(21) Appl. No.: 09/361,685

(22) Filed: Jul. 27, 1999

(51) Int. Cl.$^7$ ........................................ G03F 9/00
(52) U.S. Cl. ........................................ 430/5
(58) Field of Search ............... 430/5, 322; 378/35; 250/492.22

(56) References Cited

U.S. PATENT DOCUMENTS

| | | | |
|---|---|---|---|
| 3,892,973 | 7/1975 | Coquin et al. | 250/505 |
| 4,037,111 | 7/1977 | Coquin et al. | 250/505 |
| 5,146,481 | 9/1992 | Garg et al. | 378/35 |
| 5,155,749 | 10/1992 | DiMillia et al. | 378/35 |
| 5,580,687 | * 12/1996 | Leedy | 430/5 |
| 5,756,234 | 5/1998 | Groves et al. | 430/5 |
| 5,781,607 | 7/1998 | Acosta et al. | 378/34 |
| 5,793,836 | 8/1998 | Maldonado et al. | 378/35 |
| 5,876,880 | 3/1999 | Vonach et al. | 430/5 |

OTHER PUBLICATIONS

PCT International Search Report & Transmittal PCT/US 0019012, Oct. 25, 2000.

Marumoto et al., Fabrication of Diamond Membranes for X–ray Masks by Hot–Filament Method, Jpn. J.Appl.Phys. (Dec. 1992).

Bloomstein et al., Critical Issues in 157 nm Lithography, J.Vac.Sci.Tech.B. (Nov./Dec. 1998).

Bloomstein et al., Optical Materials and Coatings at 157 nm SPIE Mar. 1999.

* cited by examiner

Primary Examiner—S. Rosasco
(74) Attorney, Agent, or Firm—Greg Leitich

(57) ABSTRACT

An optical mask for high resolution optical lithography using short wavelength light, e.g., 157 nm, uses membranes of a material that is transparent to the desired wavelength. The thin membranes are held under tensile stress by a supporting structure, such as a silicon wafer. Because the membranes are thin, the heating of the membrane material during generation of the overlying lithographic patterns is reduced. This is particularly advantageous when a material such as calcium fluoride is used as the transparent medium of the mask because calcium fluoride has a high thermal expansion coefficient. Thus, the membrane will suffer little distortion during the production of the mask. The lithographic pattern is produced using a thin layer of a absorptive material, such as palladium. Because both the absorptive material and the membrane are thin, there is little back scattering during the generation of the lithographic pattern by e-beam writing, and consequently, no proximity correction is necessary.

26 Claims, 5 Drawing Sheets

MASK FOR HIGH RESOLUTION OPTICAL LITHOGRAPHY

FIELD OF THE INVENTION

The present invention relates to masks for optical lithography, and in particular to masks for high resolution optical lithography.

BACKGROUND

Semiconductor devices, such as integrated circuits, are manufactured by replicating patterns onto a surface of a device substrate. The replication process typically involves lithographically transferring a pattern that is on a mask onto the device substrate using an illumination source, such as electron beam, x-ray and optical.

Membrane masks are known for use in x-ray lithography. A membrane mask uses a membrane supported by a frame. The membranes are typically made of silicon, doped silicon, silicon carbide, silicon nitride, diamond, or similar material. Because x-ray wavelengths are quickly absorbed in a substrate, thin membranes are necessary so that the x-rays may be transmitted through the substrate. Typically, the membranes are less than 5 μm (micrometers) thick and are thus typically delicate and expensive to manufacture. Further, x-ray absorber films used on x-ray masks absorb rather than reflect incident radiation.

Membrane masks are not used in optical lithography because conventional optical lithography uses wavelengths that are readily transmitted through thick substrates. Thus, there is no need to incur the expense and trouble of generating a delicate membrane mask for optical wavelengths.

In optical lithography, a conventional mask includes a pattern of opaque material, such as chrome, overlying a relatively thick substrate of glass or quartz, which is transparent to the wavelength of light being used. The incident light is absorbed and reflected by the opaque material and transmitted through the substrate to expose the device substrate (or an overlying photoresist layer) with the mask's pattern.

The glass or quartz substrate of conventional optical masks is free standing, i.e., without a supporting frame, and is typically several millimeters thick. Thick silicon or quartz substrates are adequately transparent for relatively long wavelengths of light, e.g., 193 or 248 nm (nanometers). However, for high resolution optical lithography shorter wavelength light, e.g., 157 nm, may be used. Thick glass or quartz substrates lack the desired transmissiveness for short wavelength light. Present efforts to develop thick transparent materials for 157 nm focus on material modification (doping) or OH removal of fused silica to increase the optical transmission.

A material that is at least partially transparent at short wavelengths is calcium fluoride ($CaF_2$). Unfortunately, $CaF_2$ has a high thermal expansion coefficient, approximately 40 times that of conventional glass or quartz. During production of the overlying pattern, for example using e-beam writing, a large amount of heat is typically transferred to the substrate. Thus, a substrate with a high thermal expansion coefficient will distort during production of the overlying patterns. Consequently, if the thick glass or quartz substrate in a conventional optical mask is replaced with a $CaF_2$ substrate, e-beam writing will heat the $CaF_2$ substrate causing the $CaF_2$ substrate to distort resulting in distortion of the overlying pattern. This distortion may be difficult to correct for the ground rules of future device generations.

Thus, there is a need for masks that may be used for high resolution, i.e., short wavelength, optical lithography that are not distorted when the overlying pattern is generated.

SUMMARY

An optical mask structure includes a membrane that is at least partially transmissive to light of a desired wavelength, such as 157 nm. The optical mask may be used in a lithography system to generate a device, such as a semiconductor device. The membrane is supported on a substrate that holds it under tensile stress. The lithography pattern lies over the membrane. Advantageously, the membrane is sufficiently thin and is mounted on a support frame so as to reduce distortion of the membrane caused by heating during the generation of the overlying pattern. This is particularly advantageous where $CaF_2$ is used as the membrane, which has a high thermal expansion coefficient. In addition, because the membrane is thin, when generating the overlying pattern, for example with e-beam writing, the membrane will cause little back scattering of the electrons. Further, a thin layer of absorbing material, such as palladium, is used as the material for the pattern overlying the membrane. Because the absorber is thin, little back scattering of the electrons occurs. Consequently, there are little or no proximity effect corrections necessary during generation of the overlying patterns.

The optical mask is produced by providing a substrate of, e.g., silicon or fused silica, upon which is formed a layer of the membrane material, e.g., $CaF_2$ or doped OH free fused silica. The silicon or fused silica is etched back to the membrane material to define a membrane area. A layer of absorptive or reflective material is deposited over the membrane material and patterned and etched to from the desired lithography pattern over the membrane area. The layer of membrane material is deposited sufficiently thin that heating and distortion of the membrane area during patterning of the overlying layer is reduced.

DETAILED DESCRIPTION

Figure 1:
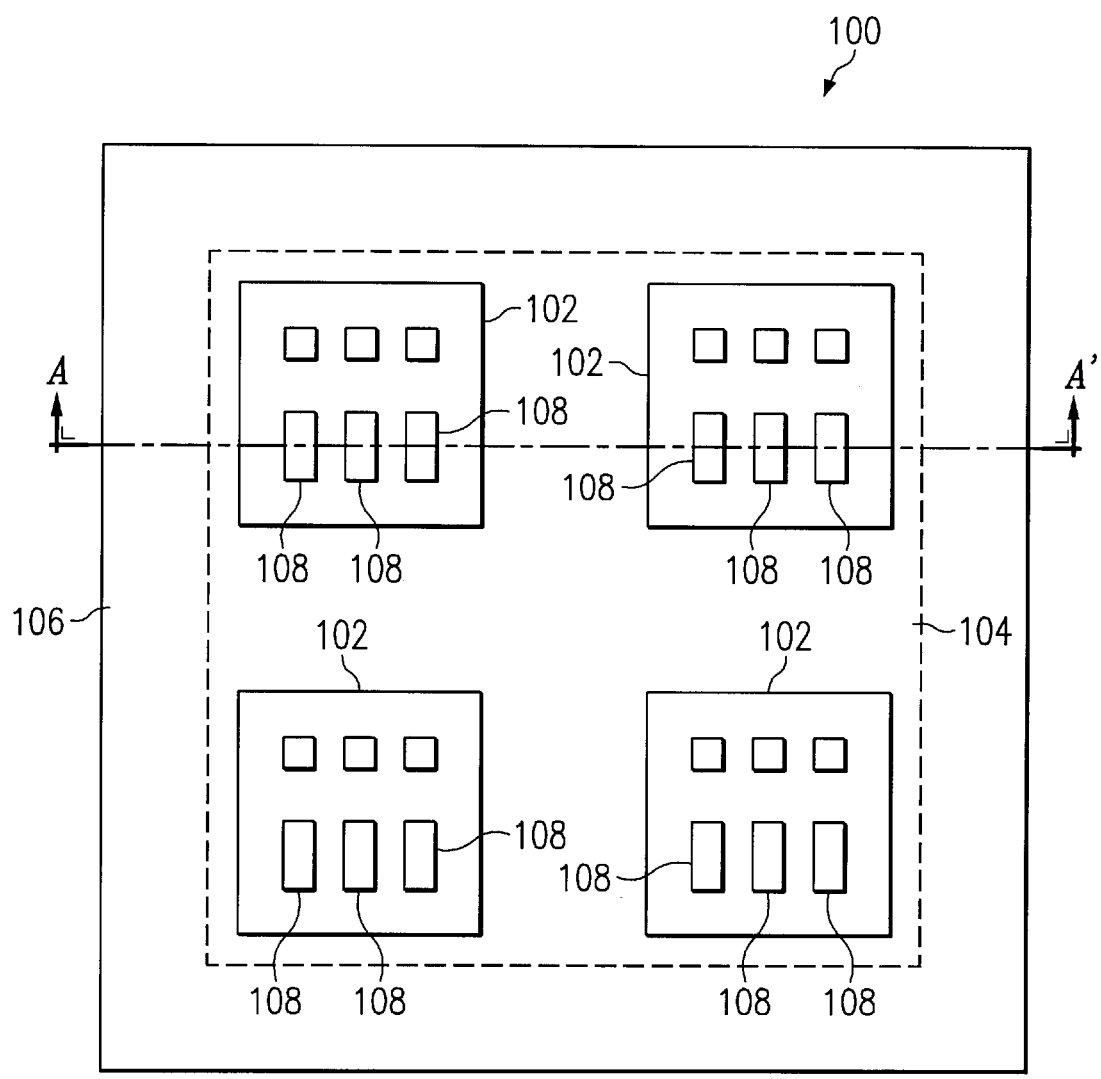
FIG. 1 shows a top (plan) view of a membrane mask structure for high resolution optical lithography in accordance with an embodiment of the present invention.
Figure 2:
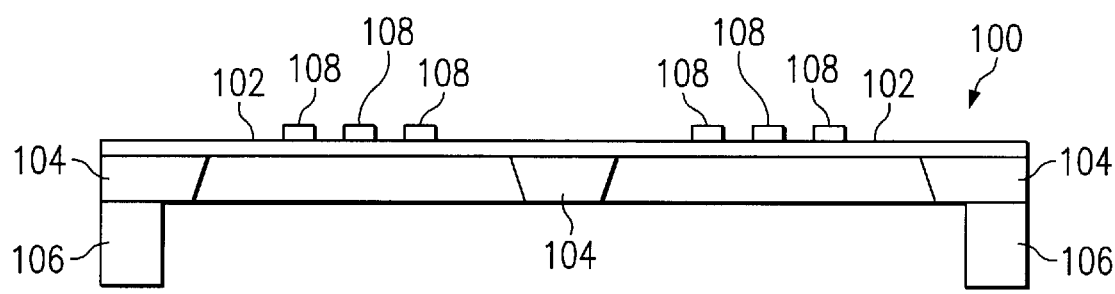
FIG. 2 shows a cross-sectional view of the mask structure taken along line A-A' shown in FIG. 1.

FIG. 1 shows a top (plan) view of a membrane mask structure 100 for high resolution optical lithography in accordance with an embodiment of the present invention. FIG. 2 shows a cross-sectional view of mask structure 100 taken along line A-A' shown in FIG. 1. Mask structure 100 consists of several relatively small membranes 102 supported under tensile stress by a substrate 104, which is mounted on a thick frame 106, indicated by the broken line. Absorbers 108 overlie membranes 102 defining the desired pattern which is to be lithographically transferred.

Membranes 102 are made of a material that is transmissive at the desired optical wavelength. Thus, for short wavelengths, e.g., 157 nm, suitable materials for membranes 102 include $CaF_2$, fused silica doped with fluorine (F), OH free fused silica or a combination of such materials. Of course, other materials may be used as long as the material is adequately transparent in the desired optical wavelength.

Membranes 102 have a thickness, e.g., between 1 and 20 $\mu$m (micrometers). The use of thin membranes 102 advantageously avoids problems that are associated with the use of thick materials in conventional optical lithography masks, such as crystalline homogeneity, optical absorption, and flatness. Further, the use of a thin membrane ameliorates the distortion problems associated with generating the overlying pattern. Because the membrane 102 is thin, when e-beam writing the desired pattern of absorber 108, the electrons will not be completely absorbed by membrane 102 but most will be transmitted through membrane 102. Consequently, less heat is transferred to the thin membrane 102 as it would be to a thick substrate. Thus, when membrane 102 is made from a material with a high thermal expansion coefficient, such as $CaF_2$, little heat will be transmitted to membrane 102, thereby limiting undesired distortion. The chosen thickness of membrane 102 is determined by factors such as stability of the membrane 102, i.e., lack of distortion, strength, film surface roughness requirements, as well as maximization of transmission of the desired wavelength.

The use of multiple membranes 102 in mask structure 100, such as that shown in FIGS. 1 and 2, may be advantageous to meet the requirements of mask handling (strength) and stability (pattern placement and radiation damage), which are functions of the membrane size to thickness ratio. Thus, for example, if a very thin membrane is desired, to increase stability the size of the membrane may be reduced to meet the strength requirements. In another embodiment of the present invention, mask structure 100 uses a single large membrane. A single membrane mask may be advantageous for exposure tool considerations, such as limiting stitching errors.

The supporting substrate 104 is made of a silicon or fused silica (doped or undoped) wafer or other material having a low thermal expansion coefficient. The thickness of the supporting substrate 104 and the width between membranes 102 are chosen to provide adequate support for membranes 102. For example, the width between membranes 102 may range from 0.1 to 5 mm. Because the membranes 102 are under tensile stress, the thermal expansion of the membranes 102 is determined by the supporting substrate 104. Stress levels, e.g., may range from $5-10 \times 10^8$ dynes/cm$^2$.

Supporting substrate 104 is mounted on a relatively thick frame 106 that has similar thermal expansion characteristics as the supporting substrate 104. Frame 106 may be made of fused silica or, e.g., a glass material known under the tradename "Pyrex."

The opaque absorbers 108 are made of a material with good etching qualities, high optical absorption, and low reflection at the desired wavelength. For example, a 100 to 500 Å thick palladium (Pd) film may be used because it has adequate characteristics for 157 nm wavelength light. Of course, other materials may be used to form absorbers 108. In addition, absorbers 108 should have a low Young's modulus relative to the substrate to minimize stress induced distortion.

Of course, if desired, absorbers 108 may be replaced with a reflecting material. However, a reflective system is difficult to make. Moreover, the use of a thin film as absorber 108, such as 500 Å of Pd is advantageous because during e-beam writing there is little back scattering and thus little or no proximity error correction is required. Additionally, because membrane 102 is thin, membrane 102 also causes little back scattering of the e-beam, which eliminates the need for proximity error correction.

Where multiple membranes 102 are used, each membrane may carry a portion of the lithographic pattern defined by the absorbers 108. During lithography the pattern on each membrane may be sequentially scanned, stepped and aligned to another membrane pattern to define the complete pattern on the device substrate. The optical tool/mask system must be designed to minimize stitching errors. However, if a single membrane is used, the entire lithographic pattern may be produced on the one membrane. Thus, the lithographic process is simplified with the use of a single membrane.

Figure 3:
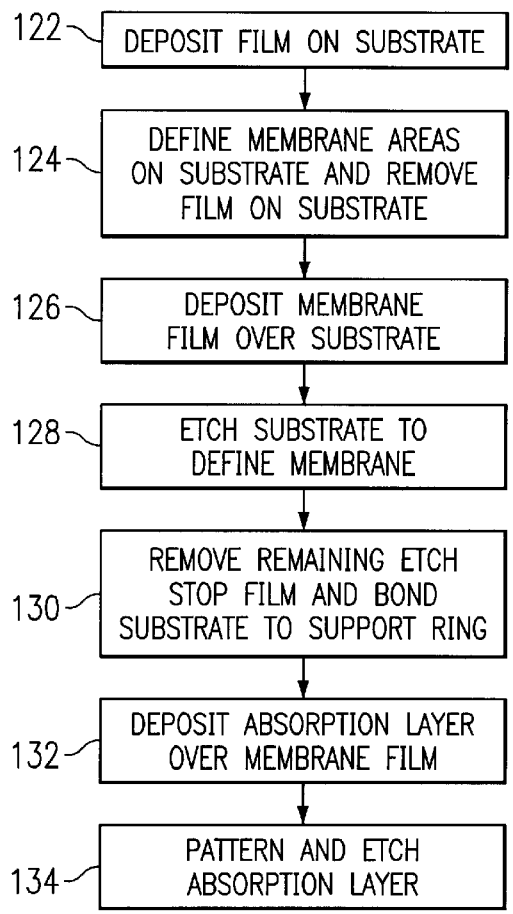
FIG. 3 is a flow chart of the fabrication used to produce the mask structure shown in FIG. 1.
Figure 4A:
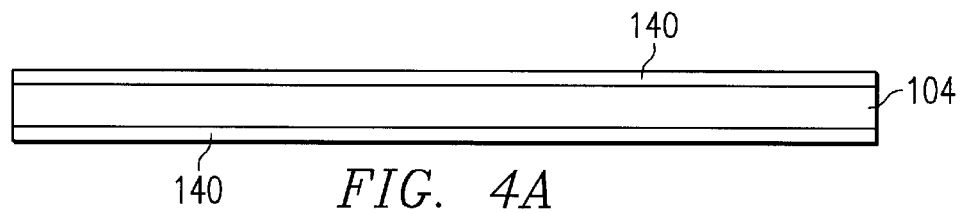
FIGS. 4A through 4E are simplified cross-sectional views of a membrane mask at various stages in the fabrication in accordance with an embodiment of the present invention.

Fabrication steps that may be used to produce mask structure 100 are illustrated in the flow chart of FIG. 3, and the resulting structure is shown in FIGS. 4A–4E. In the first step 122, an etch stop film 140, e.g., of silicon oxide, is deposited or grown on a substrate 104, as shown in FIG. 4A. The film 140 is used to define the membrane areas on substrate 104.

Figure 4B:
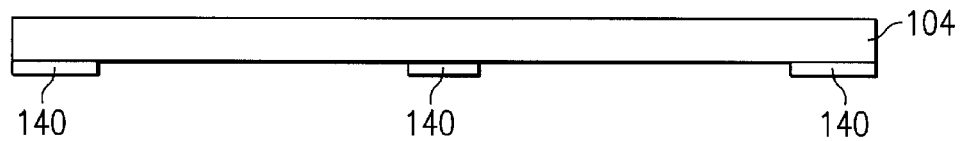

In the next step 124, using conventional lithography methods and etching techniques, the film 140 is removed from one side of substrate 104 in the membrane areas and is completely removed from the other side of the substrate 104. The resulting structure is shown in FIG. 4B.

In the next step 126, a film 142, for example 1–20 $\mu$m of $CaF_2$ or other suitable material, is deposited over substrate 104. Film 142 may be deposited using chemical vapor deposition (CVD), sputtering, or any other appropriate technique. However, once the film 142 is deposited, particularly if deposited by CVD, it may be necessary to polish the surface of film 142, e.g., using chemical mechanical polishing, to meet the desired surface roughness requirements.

Figure 4C:
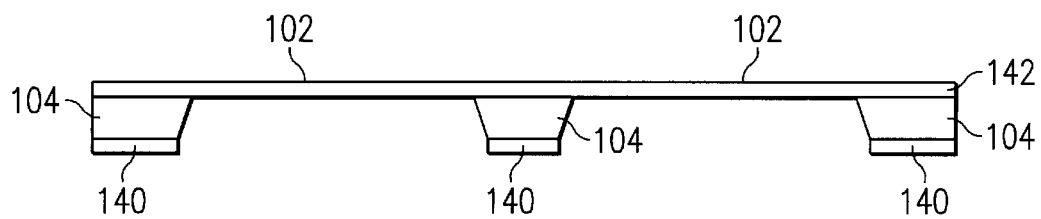

In the next step 128, using conventional lithography techniques the substrate 104 is etched in the membrane areas to define membranes 102. Substrate 104 may be etched using reactive ion etching or any other conventional etching method. The resulting structure is shown in FIG. 4C.

Figure 4D:
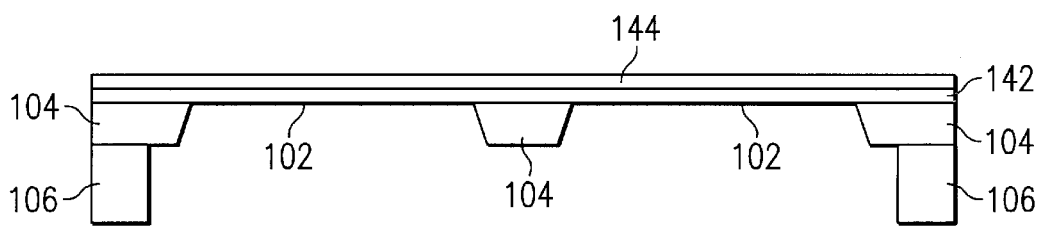

The remaining film 140 on substrate 104 is then stripped in step 130 and the substrate 104 is then anodic bonded to the support ring 106. The absorber film 144 is then deposited over the membrane film 142 in step 132. It should be understood that step 132 may be performed earlier as well, for example, prior to step 128 or step 130. The resulting structure is shown in FIG. 4D.

Figure 4E:
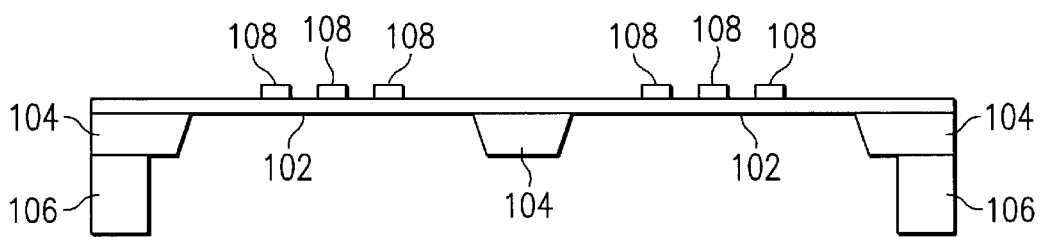

The absorber film 144 is then patterned and etched using conventional lithography and etching techniques in step 134. The resulting structure is shown in FIG. 4E. The distortion of the absorber pattern is determined in first order by the ratio of the Young's moduli and the thickness of the absorber and substrate as:

$$\frac{E_a \times t_a}{E_s \times t_s} << 1; \qquad \text{equ.1}$$

where Ea and Es are the Young's moduli of the absorber 108 and membrane 102, respectively, and ta and ts are the thicknesses of the absorber and the membrane 102, respectively.

Figure 5:
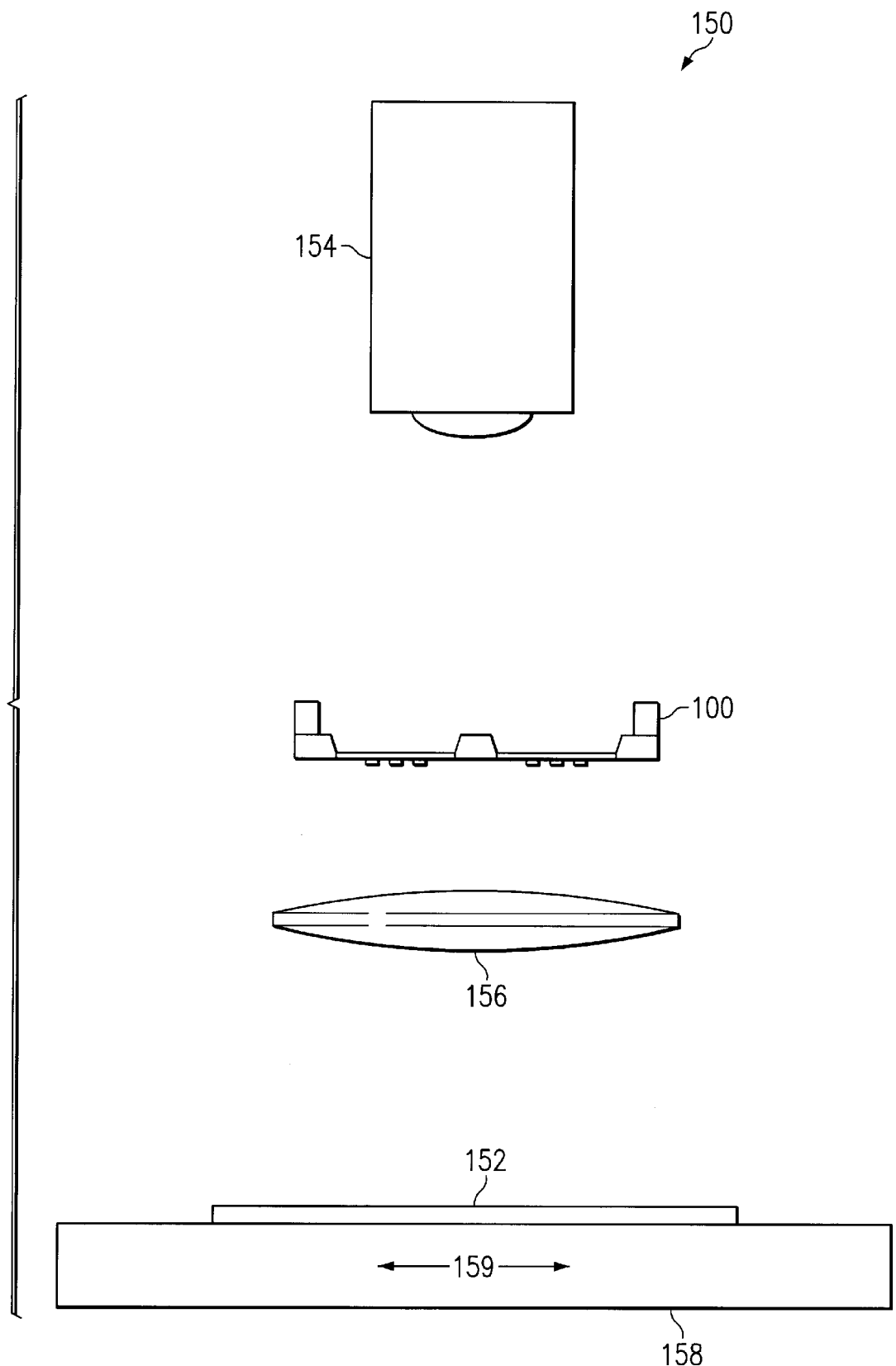
FIG. 5 shows a side view of a conventional NX reduction optical lithography tool using a membrane mask structure.

FIG. 5 shows a side view of relevant portions of a conventional NX reduction optical lithography tool 150 using mask structure 100 to transfer a pattern onto a device substrate 152. As shown in FIG. 5, lithography tool 150 includes a light source 154 that illuminates mask structure 100 and a projection lens system 156 that focus the light passing through mask structure 100 onto device substrate 152. Mask structure 100 also rests on a suitable support such as a conventional mask stage (not shown). While projection lens system 156 is shown in FIG. 5 as a single lens for the sake of simplicity, it should be understood that multiple lenses are typically used. Moreover, part of the lens system 156 may be located between light source 154 and mask structure 100. Device substrate 152 is positioned on a stage 158 that is movable as illustrated by arrows 159. During operation, stage 158 moves device substrate 152 to align each membrane pattern with another membrane pattern to complete the desired pattern on the device substrate 152. Optical lithography tool 150 may be any conventional optical lithography tool, the operation of which is well known in the art.

Figure 6:
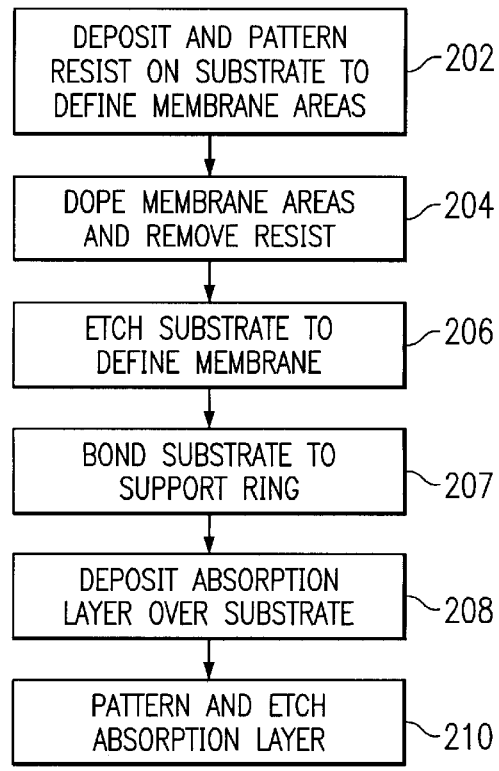
FIG. 6 is a flow chart of the fabrication used to produce a membrane mask structure shown in FIGS. 7A through 7E.
Figure 7A:
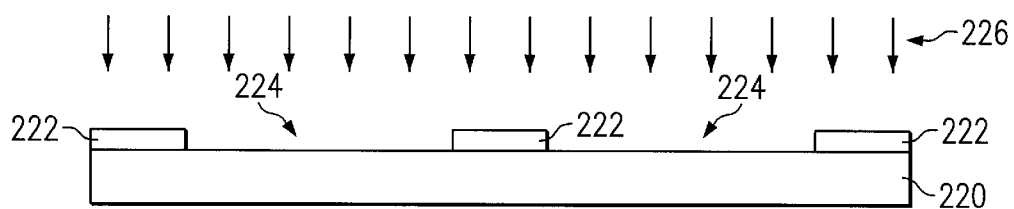
FIGS. 7A through 7E are simplified cross-sectional views of a membrane mask at various stages in the fabrication in accordance with another embodiment of the present invention.
Figure 7B:
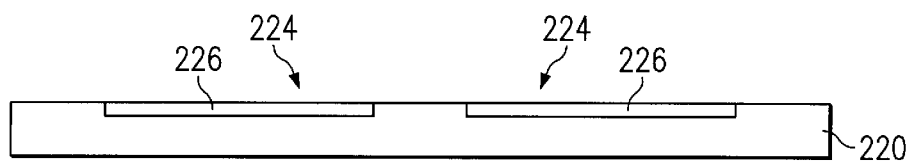

Fabrication steps that may be used to produce another embodiment of a membrane mask structure are illustrated in the flow chart of FIG. 6, with the resulting structure shown in FIGS. 7A–7E. In the first step 202, shown in FIG. 6, a resist layer 222 is conventionally deposited and patterned over a fused silica substrate 220 to define membrane areas 224. In the next step 204, the membrane areas 224 are then doped with a dopant 226, such as fluorine or other appropriate dopant. Membrane area 224 may be doped by implanting, diffusion or any other appropriate manner. FIG. 7A shows membrane areas 224 of substrate 220 being doped with dopant 226. The dopant is located to a depth appropriate for the desired membrane, e.g., 10 $\mu$m. The resist 222 is then removed. FIG. 7B shows substrate 220 with a dopant implant 226 in membrane areas 224 with a depth proportional to the desired membrane thickness. It should be understood, however, that the entire thickness of substrate 220 may be doped if desired. Further, the entire surface of fused silica substrate 220 may be doped as opposed to doping only the membrane areas 224.

Figure 7C:
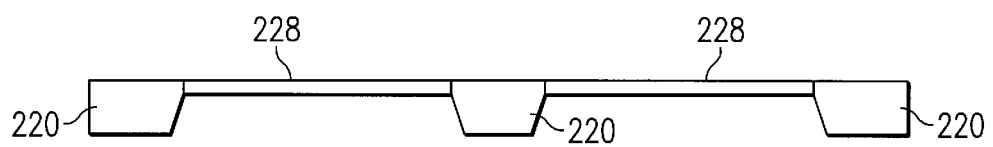

In the next step 206, the substrate 220 is etched to define the membranes 228 of a desired thickness. As shown in FIG. 7C, the substrate of fused silica 220 is etched leaving a membrane 228 of doped fused silica. The etching of substrate 220 may be performed in a manner described in FIGS. 3 and 4A through 4C, if desired. Advantageously, membranes 228 are under tensile stress because they are formed by properly doping the fused silica. Alternatively, OH removed radicals may be from the fused silica surface instead of doping.

Figure 7D:
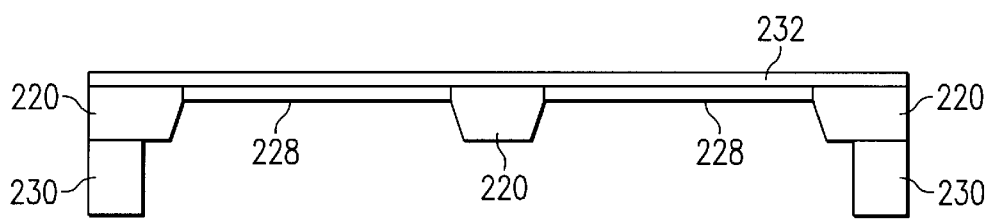

The substrate 220 is then anodic bonded to a support ring 230 in step 207. In step 208, the absorber film 232 is deposited over the membranes 228. It should be understood that step 208 may be performed earlier as well, for example, prior to step 206. The resulting structure is shown in FIG. 7D.

Figure 7E:
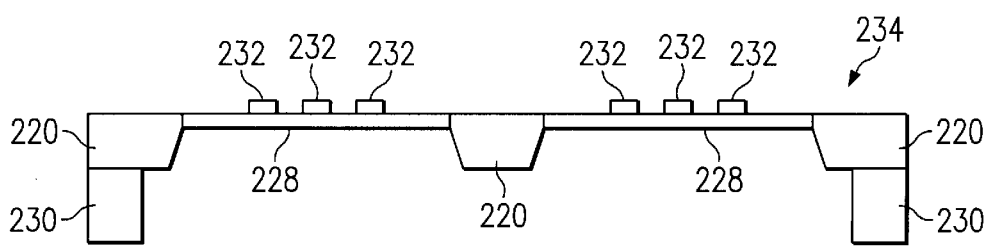

The absorber film 232 is then patterned and etched using conventional lithography and etching techniques in step 210. An anti-reflection film may be placed on top of the absorber. The resulting structure is shown in FIG. 7E.

Figure 8:
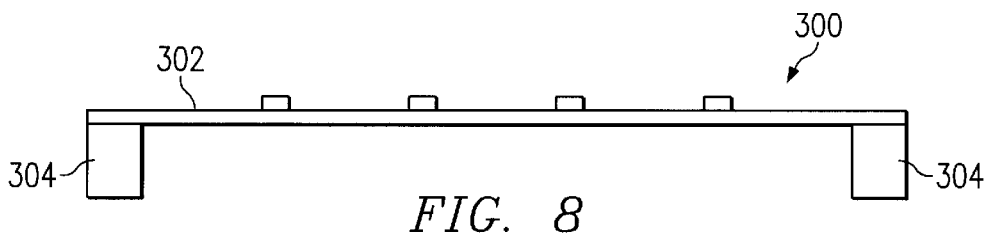
FIG. 8 shows a cross-sectional view of a mask structure for high resolution optical lithography in accordance with another embodiment of the present invention.

FIG. 8 shows a cross-sectional view of a mask structure 300 for high resolution optical lithography in accordance with another embodiment of the present invention. Mask structure 300 includes a thin plate 302, approximately 1–2 mm thick, of a material that is optically transparent at the desired wavelength, e.g., 157 nm. For example, plate 302 may be manufactured from calcium fluoride $CaF_2$ or other appropriate material. Plate 302 supports opaque patterns 306, which are made from a material with good etching qualities, high optical absorption, and low reflection at the desired wavelength, as described above.

Unlike membranes 102, shown in FIG. 2, which are held under tensile stress, plate 302 is rigid and is supported on a support ring 304. Support ring 304 is made of a material with a slightly larger thermal expansion than plate 302 to avoid buckling of the plate 302.

Use of mask structure 300 with plate 302 mounted on a support ring 304 advantageously ameliorates the problems associated with handling and mask distortion of a free standing thin substrate.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. The spirit and scope of the appended claims should not be limited to the foregoing description.

What is claimed is:

1. An optical mask structure comprising:
   a membrane that is at least partially optically transmissive of light;
   a supporting substrate supporting said membrane, said supporting substrate holding said membrane under tensile stress, said supporting substrate having a thickness that is greater than that of said membrane; and
   a pattern of opaque and partially reflective material overlying said membrane.

2. The optical mask structure of claim 1, further comprising a supporting ring mounted to said supporting substrate.

3. The optical mask structure of claim 1, wherein said membrane comprises calcium fluoride, OH free or doped fused silica.

4. An optical mask structure comprising:
   a membrane that is at least partially optically transmissive of light;
   a supporting substrate supporting said membrane, said supporting substrate holding said membrane under tensile stress, said supporting substrate having a thickness that is greater than that of said membrane; and
   a pattern of opaque and partially reflective material overlying said membrane;
   wherein said membrane has a thickness between 1 and 20 $\mu$m.

5. The optical mask structure of claim 1, further comprising multiple membranes supported by said supporting structure.

6. The optical mask structure of claim 1, wherein said pattern of material overlying said membrane comprises a light absorbing and partially reflecting material.

7. The optical mask structure of claim 6, wherein said light absorbing material is palladium.

8. The optical mask structure of claim 1, wherein aid membrane is at least partially transmissive to light having a wavelength of about 157 nm.

9. The optical mask structure of claim 1, wherein membrane and said supporting structure are integrally formed.

10. The optical mask structure of claim 9, wherein said supporting structure comprises fused silica and said membrane comprises OH free or doped fused silica.

11. An optical lithography system comprising:
   an illumination source producing light;
   an optical mask structure comprising:
      a membrane that is at least partially optically transmissive to said light;
      a supporting substrate supporting said membrane, said supporting substrate holding said membrane under tensile stress;
      a pattern of opaque material overlying said membrane; and
      a projection lens located for focusing light transmitted through said optical mask onto a substrate.

12. The system of claim 11, wherein said illumination source produces light having a wavelength of about 157 nm.

13. The device of claim 11, wherein said membrane comprises calcium fluoride or OH free or doped fused silica and said pattern of material overlying said membrane comprises palladium.

14. An optical lithography system comprising:
   an illumination source producing light;
   an optical mask structure comprising:
      a membrane that is at least partially optically transmissive to said light;
      a supporting substrate supporting said membrane, said supporting substrate holding said membrane under tensile stress;
      a pattern of opaque material overlying said membrane; and
      a projection lens located for focusing light transmitted through said optical mask onto a substrate;
      wherein said membrane has a thickness between 1 and 20 $\mu$m.

15. A method of producing an optical mask, said method comprising:
   providing a substrate;
   forming membrane material on said substrate, said membrane material is at least partially transmissive at a desired wavelength;
   etching areas of said substrate to said membrane material to define a membrane;
   depositing a layer of a second material over said membrane;
   patterning said layer of said second material in a desired pattern over said membrane; and
   etching said layer of said second material to form said desired pattern over said membrane;
   wherein said membrane is sufficiently thin to reduce heating and distortion of said membrane during said patterning said layer of said second material.

16. The method of claim 15, wherein forming membrane material on said substrate comprises depositing a layer of membrane material over said substrate.

17. The method of claim 15, wherein forming membrane material on said substrate comprises doping or removing OH radicals from the substrate surface to form said membrane material.

18. The method of claim 15, wherein said membrane material comprises calcium fluoride or doped fused silica.

19. The method of claim 15, wherein said second material comprises palladium.

20. The method of claim 15 further comprising bonding said substrate to a supporting ring.

21. The method of claim 15 further comprising polishing said layer of membrane material prior to depositing said layer of second material over said layer of membrane material.

22. A method of producing an optical mask, said method comprising:
   providing a substrate;
   forming membrane material on said substrate, wherein said membrane material is at least partially transmissive at a desired wavelength;
   etching areas of said substrate to said membrane material to define a membrane;
   depositing a layer of a second material over said membrane;
   patterning said layer of said second material in a desired pattern over said membrane; and
   etching said layer of said second material to form said desired pattern over said membrane;
   wherein said membrane is sufficiently thin to reduce heating and distortion of said membrane during said patterning said layer of said second material,
   wherein said layer of membrane material is deposited to a thickness of 1 to 20 $\mu$m.

23. An optical mask structure comprising:
   a rigid plate that is at least partially optically transmissive of light, said rigid plate having a thermal expansion coefficient of a first value;
   a supporting ring mounted to said rigid plate, said supporting ring having a thermal expansion coefficient of a second value that is greater than the thermal expansion coefficient of said first value; and
   a pattern of opaque material overlying said rigid plate.

24. The optical mask structure of claim 23, wherein said rigid plate is at least partially transmissive to light having a wavelength of about 157 nm.

25. The optical mask structure of claim 23, wherein said rigid plate comprises calcium fluoride or doped fused silica.

26. The optical mask structure of claim 23, wherein said rigid plate is approximately 1–2 mm thick.

* * * * *